US009769557B2

(12) United States Patent
Sindia et al.

(10) Patent No.: US 9,769,557 B2
(45) Date of Patent: Sep. 19, 2017

(54) PROXIMITY SENSING HEADPHONES

(71) Applicant: Intel Corporation, Santa Clara, CA (US)

(72) Inventors: Suraj Sindia, Hillsboro, OR (US); Meggie Hakim, Feldkirchen (DE); Robert F. Kwasnick, Palo Alto, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/998,370

(22) Filed: Dec. 24, 2015

(65) Prior Publication Data
US 2017/0188129 A1 Jun. 29, 2017

(51) Int. Cl.
*H04R 1/10* (2006.01)
*H04R 29/00* (2006.01)
*G06F 3/16* (2006.01)
*H03G 3/30* (2006.01)
*G08B 21/02* (2006.01)
(Continued)

(52) U.S. Cl.
CPC ........... *H04R 1/1041* (2013.01); *G06F 3/167* (2013.01); *H03G 3/3005* (2013.01); *H04R 1/1008* (2013.01); *H04R 29/001* (2013.01); *G08B 1/08* (2013.01); *G08B 21/02* (2013.01);
(Continued)

(58) Field of Classification Search
CPC .. H04R 1/1041; H04R 1/1008; H04R 29/001; H04R 3/005; G06F 3/167; H04S 7/304; H03G 3/3005; G08B 1/08; G08B 21/02; Y10S 367/909
See application file for complete search history.

(56) References Cited

U.S. PATENT DOCUMENTS 7,015,812 B1* 3/2006 Lemchen ............... G08B 1/08
128/864
2015/0104041 A1* 4/2015 Kulavik ............... H04R 1/1041
381/107

OTHER PUBLICATIONS

"Intel Announces Its Intention to Wed Wearable Tech", Simon Hill, Digital Trends, Jan. 9, 2014, downloaded from http://www.digitaltrends.com/mobile/intel-bets-wearable-tech/, 3 pages.
(Continued)

*Primary Examiner* — Andrew L Sniezek
(74) *Attorney, Agent, or Firm* — Grossman, Tucker, Perreault & Pfleger, PLLC

(57) ABSTRACT

A proximity sensing headphone may include a gyroscopic sensor to determine the motion of the headphone structure and a proximity sensor to determine the movement of an external object through a three-dimensional ambient environment. A proximity sensing headphone control circuit determines the relative motion or movement between the headphone structure in the three-dimensional ambient environment and the external object in the three-dimensional ambient environment to determine at least a distance between the headphone structure and the external object and a velocity of the external object through the three-dimensional ambient environment about the headphone structure. The control circuit may provide an alert output if the determined distance between the headphone structure and the external object is less than a defined distance threshold or the velocity of the external object through the three-dimensional ambient environment about the headphone structure exceeds a defined velocity threshold.

25 Claims, 5 Drawing Sheets

(51) Int. Cl.
*G08B 1/08* (2006.01)
*H04S 7/00* (2006.01)
*H04R 3/00* (2006.01)

(52) U.S. Cl.
CPC .............. *H04R 3/005* (2013.01); *H04S 7/304* (2013.01); *Y10S 367/909* (2013.01)

(56) References Cited

OTHER PUBLICATIONS

Intel Announces Product Deal with Rapper 50 Cent, Steve Johnson, Siliconbeat, Aug. 15, 2014, downloaded from http://www.siliconbeat.com/2014/08/15/intel-announces-product-deal-with-rapper-50-cent/, 8 pages.
"Headphone Market Booming as Portable Devices Become Primary Music Player", Knowledge Partner Futuresource Consulting, Sep. 13, 2012, downloaded from http://www.ceatec.com/report_analysis/en/ra_120913_2.html, 3 pages.
"Skullcandy", 2016 ICR Conference, Jan. 13, 2016, 26 pages.
Brooklyness: "A bike helmet that warns you if a car is getting too close", http://www.fastcoexist.com/3060442/a-bike-helmet-that-warns-you-if-a-car-is-getting-too-close, downloaded May 3, 2017, 5 pages.

\* cited by examiner

PROXIMITY SENSING HEADPHONES

TECHNICAL FIELD

The present disclosure relates to headphones.

BACKGROUND

The use of over and in-ear headphones and similar devices grows increasingly prevalent. With the growth of high-quality audio produced by portable electronic devices such as media players and smartphones and the increasing use of health tracking capabilities, headphone use has soared. Headphones, including both over-ear and ear-bud headphones, provide high quality audio, but in so doing, tend to isolate the wearer from events occurring in their surroundings. Particularly at high volume levels the possibility of accidents increases. Such accidents may cause serious injury or even death. For example, a headphone wearer may be oblivious to a fast approaching automobile or similar hazard. Increasing a headphone user's awareness of dangerous situations may assist in avoiding the occurrence of such incidents.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
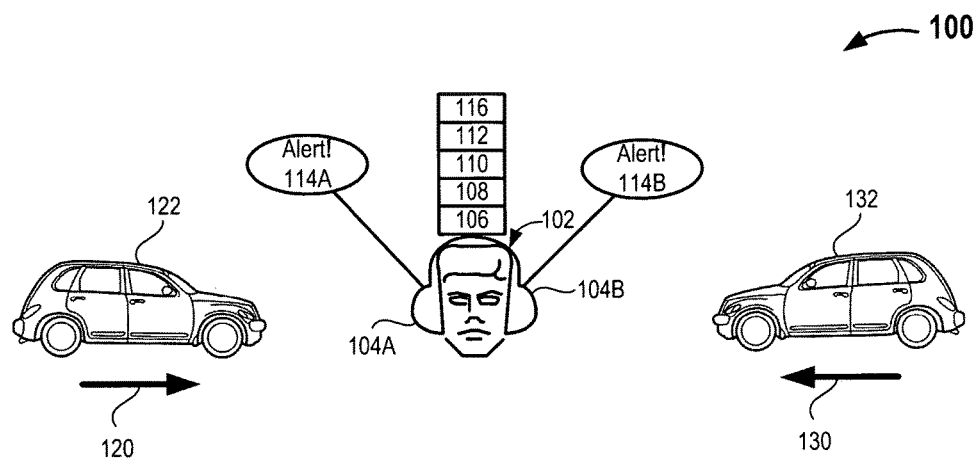
FIG. 1 is a schematic diagram of an illustrative proximity sensing headphone system, in accordance with at least one embodiment of the present disclosure.

Although the following Detailed Description will proceed with reference being made to illustrative embodiments, many alternatives, modifications and variations thereof will be apparent to those skilled in the art.

DETAILED DESCRIPTION

In order to alert a headphone user to dangers such as approaching automobiles, a headphone may be modified to incorporate one or more proximity sensing systems. Additional sensors may be added to the headphone system to provide additional sensing capabilities and to permit the headphone system to distinguish between the motion of the headphone system on a user's head from the movement of an external object. The addition of these features to a headphone or ear-bud system permits the headphone system to recognize the approach of objects and warn the headphone user of a potentially dangerous collision between the user and the external object.

The accuracy of detection provided by the headphone system may be enhanced through the addition of multiple sensing systems. In some implementations, the headphone system may include a gyroscope or similar devices or systems capable of detecting motion of the headphone system, for example as the user moves or turns their head. One or more signal processors may disambiguate the relative motion of the headset from the approaching external object. In some implementations, the headphone system may include a microphone for detecting sounds and, in some cases, identifying the source of the sound.

The rapid detection of an approaching external object that presents a hazard to the headphone user causes the headphone system to provide a human perceptible (i.e., audible, tactile, or visual) alert to the headphone user, providing the user valuable time needed to avoid the hazardous situation. In some implementations, an audible alert may include reducing or otherwise altering the sound provided by one or both of the speakers in the headphone. In some implementations, in a binaural speaker system the sound from a speaker positioned closest to the external object may be altered while the sound from the other speaker remains unaltered. In implementations where the headphones do not provide a sound output to the user (e.g., sound deadening or noise-cancelling headphones), a tactile output such as a low-frequency vibration, may be provided to the headphone wearer. In some instances, the tactile output may be provided in the side closest to the external object, again to warn the user of the direction of approach of the external object.

A proximity sensing headphone is provided. The proximity sensing headphone may include a headphone structure, a first sensor to detect motion of the headphone structure in a three-dimensional space, and a second sensor to detect a movement of an external object in the three-dimensional space external to the headphone structure. The proximity sensing headphone may also include a control circuit communicably coupled to the first sensor and the second sensor and a storage device communicably coupled to the control circuit and including machine-readable instruction sets. The machine-readable instruction sets, when executed by the control circuit, cause the control circuit to provide a proximity sensing headphone control circuit that determines a relative difference between the motion of the headphone structure and the movement of the external object in the three-dimensional space and provides a human-perceptible output upon determining that the relative difference in the motion of the headphone structure and the movement of the external object exceeds a predefined threshold.

A method of providing an indication of a presence of an external object via a proximity sensing headphone is provided. The method may include determining, by a control circuit, a relative difference between a motion of the headphone structure in a three-dimensional space and a movement of an external object in the three-dimensional space external to the headphone structure and generating, by the proximity sensing headphone control circuit, a human-perceptible output responsive to a determination that the relative difference in the motion of the headphone structure in the three-dimensional space and the movement of the external object in the three-dimensional space external to the headphone structure exceeds a predefined threshold.

A storage device that includes machine-readable instruction sets is provided. The machine-readable instruction sets, when executed by a circuit, may cause the circuit to provide a proximity sensing headphone control circuit. The control circuit may determine a relative difference between a motion of the headphone structure in a three-dimensional space and a movement of an external object in the three-dimensional space external to the headphone structure and generate a human-perceptible output responsive to a determination that the relative difference in the motion of the headphone structure in the three-dimensional space and the movement of the external object in the three-dimensional space external to the headphone structure exceeds a predefined threshold.

A system for providing an indication of a presence of an external object via a proximity sensing headphone is provided. The system may include a means for determining a relative difference between a motion of the headphone structure in a three-dimensional space and a movement of an external object in the three-dimensional space external to the headphone structure and a means for generating a human-perceptible output responsive to a determination that the relative difference in the motion of the headphone structure in the three-dimensional space and the movement of the external object in the three-dimensional space external to the headphone structure exceeds a predefined threshold.

A proximity sensing headphone control circuit is provided. The proximity sensing headphone control circuit may include at least one circuit and at least one storage device that includes machine-readable instruction sets. The machine-readable instruction set, when executed by the at least one circuit, may cause the at least one circuit to determine a relative difference between a motion of a headphone structure in a three-dimensional space and a movement of an external object in the three-dimensional space external to the headphone structure and may cause a communicably coupled output device to generate a human-perceptible output responsive to a determination that the relative difference in the motion of the headphone structure in the three-dimensional space and the movement of the external object in the three-dimensional space external to the headphone structure exceeds a predefined threshold.

As used herein, the term "headphone structure" refers to any member, device, system, or combination thereof that is capable of supporting one or more devices, systems or combinations thereof either in or proximate a user's ear or auditory canal. In embodiments, a headphone structure may include one or more flexible and/or rigid members or combinations thereof that carry an "over the ear" device such as an over the ear audio output device or an over the ear noise suppression or cancellation device. In embodiments, a headphone structure may include one or more flexible and/or rigid members or combinations thereof that carry an "in-ear" device such as an earbud or similar device.

As used herein, the terms "left" and "right" are intended as relative and not absolute references. Thus a speaker described as a "left speaker" may, at times, be positioned on a user's left ear and may, at other times, be positioned on the user's right ear, for example when the orientation of the headphones on the user's head is reversed.

As used herein, the term "external object" may refer to any size or type of external object. The external object may be an animate object (e.g., dog, person) or an inanimate object (e.g., automobile, truck).

FIG. 1 provides a schematic of an illustrative proximity sensing headphone system 100, in accordance with at least one embodiment of the present disclosure. The system 100 may include a proximity sensing headphone 102. The proximity sensing headphone 102 may include a number of audio output devices 104A-104B (collectively, "audio output devices 104"), such as a right speaker 104A and a left speaker 104B. The proximity sensing headphone 102 includes at least one proximity sensing device and/or systems 106 ("proximity sensor(s) 106"). The proximity sensing headphone 102 also includes at least one gyroscopic sensing device and/or systems 108 ("gyroscopic sensor(s) 108"). In embodiments, the proximity sensing headphone 102 may include any number of additional sensors, sensing devices, and/or sensing arrays. For example, in some embodiments, the proximity sensing headphones 102 may include one or more audio sensing devices and/or systems ("audio sensor(s) 110"), such as one or more microphones and/or one or more still or moving image acquisition devices. The proximity sensing headphone 102 may include one or more control circuits 112 that receive signals from the proximity sensor(s) 106, gyroscopic sensor(s) 108, and/or audio sensor(s) 110.

In embodiments, upon detecting an external object at a distance less than a defined threshold and/or having a velocity that exceeds a defined threshold, the one or more control circuits 112 may cause a human perceptible alert output 114. In some implementations, the one or more control circuits 112 may cause a human perceptible alert 114 that alerts the headphone user to the direction of approach of the external object. For example, the one or more control circuits 112 may provide an audible alert 114A via the right audio output device 104A to indicate an approach 120 of an external object 122 from the right. In another example, the one or more control circuits 112 may provide an audible alert 114B via the left audio output device 104B to indicate an approach 130 of an external object 132 from the left.

The one or more audio output devices 104 may include any number and/or combination of current and/or future developed devices and/or systems capable of converting either an analog electrical signal or a digital electrical signal to a human perceptible audio output. In at least some implementations, the one or more audio output devices 104 may include a conventional elastomeric diaphragm operably coupled to a magnetic element that is displaced by a time-varying electromagnetic field corresponding to an electrical signal received by the one or more audio output devices 104.

The one or more proximity sensor(s) 106 may include any number and/or combination of current and/or future developed sensors, sensor systems, and/or sensor arrays capable of determining at least one of: a presence, a distance, and/or a location of any number of objects disposed in three-dimensional space external to the proximity sensing headphone 102. The one or more proximity sensor(s) 106 may generate or otherwise produce one or more outputs that include data or information indicative of at least one of: a presence, a distance, and/or a location of any number of objects disposed in the three-dimensional space external to the proximity sensing headphone 102.

In some implementations, the one or more proximity sensor(s) 106 may include one or more electromagnetic induction proximity sensors. In such an implementation, the one or more electromagnetic induction proximity sensors may include an LC tank circuit that generates an oscillating electromagnetic field inductively coupled to a load (i.e., the three-dimensional ambient environment surrounding the proximity sensing headphone 102) via a transformer. As an external object moves through the three-dimensional ambient environment surrounding the proximity sensing headphone 102, the load presented to the primary side of the transformer increases, attenuating the amplitude of the oscillation on the primary side of the transformer. The amplitude of the oscillation on the primary side of the transformer may be used to estimate the distance between the external object and the one or more electromagnetic induction proximity sensors.

In some implementations, the one or more proximity sensor(s) 106 may include one or more capacitively coupled proximity sensors. In such an implementation, the one or more capacitively coupled proximity sensors generate an electrostatically charged surface that is used to create a static electric field. A mutual capacitance is created between the charged surface and the three-dimensional ambient environment surrounding the proximity sensing headphone 102. The entry of an external object into the three-dimensional ambient environment surrounding the proximity sensing headphone 102, changes or alters the capacitance between the electrostatically charged surface and the three-dimensional ambient environment surrounding the proximity sensing headphone 102. Capacitive sensing circuitry may be used to determine the distance between the external object and the one or more capacitively coupled proximity sensors.

In some implementations, the one or more gyroscopic sensor(s) 106 may include one or more time-of-flight (TOF) proximity sensors, such as one or more LIDAR proximity sensors. In such an implementation, an emitter emits modulated electromagnetic radiation into the three-dimensional ambient environment surrounding the proximity sensing headphone 102. The electromagnetic radiation reflects off external objects present within the three-dimensional ambient environment surrounding the proximity sensing headphone 102 and returns to the one or more TOF proximity sensors. The time-of-flight of the electromagnetic radiation provides an indication of the distance between the external object and the one or more time-of-flight (TOF) proximity sensors.

In some implementations, the one or more control circuits 112 may receive a signal from the one or more proximity sensor(s) 106 on a regular, periodic, aperiodic, or intermittent basis. In such implementations, the one or more control circuits 112 may determine at least one of: a direction of travel or a velocity of the object in the three-dimensional space external to the proximity sensing headphone 102. For example, the one or more control circuits 112 may estimate the velocity of an external object the three-dimensional ambient environment of the proximity sensing headphone 102 by calculating the time rate of change in amplitude of the electromagnetic field generated by the one or more electromagnetic induction proximity sensors. In another example, the one or more control circuits 112 may estimate the velocity of an external object the three-dimensional ambient environment of the proximity sensing headphone 102 by calculating the time rate of change in capacitance generated by the one or more capacitively coupled proximity sensors.

The one or more gyroscopic sensor(s) 108 may include any number and/or combination of current and/or future developed sensors, sensor systems, and/or sensor arrays capable of determining the motion or movement of the proximity sensing headphone 102. For example, the one or more gyroscopic sensor(s) 108 may include one or more sensors, sensor arrays, or sensor systems able to provide one or more outputs that include data or information indicative of the motion of the proximity sensing headphone 102 within a three-dimensional space. In embodiments, the motion of the proximity sensing headphone 102 may be attributable, at least in part, to the head and/or body movements of the wearer.

In some implementations, the one or more control circuits 112 may receive a signal from the one or more gyroscopic sensor(s) 108 on regular, periodic, aperiodic, or intermittent basis. In such implementations, the one or more control circuits 112 may determine one or more relative parameters such as a direction of travel and/or velocity of an external object 120, 130 in the three-dimensional space external to the proximity sensing headphone 102 and the movement of the proximity sensing headphones 102. Such may advantageously permit the selective filtering of stationary objects external to the proximity sensing headphone 102 that appear to "move" based on a movement or displacement of the wearer's body and/or head.

The one or more gyroscopic sensor(s) 108 provide the proximity sensing headphones 102 with the capability to distinguish relative motion of the one or more proximity sensor(s) 106 and the three-dimensional ambient environment surrounding the proximity sensing headphones 102. Such movement may be attributed to several sources, including but not limited to: relatively rapid movement of the one or more proximity sensor(s) 106 (e.g., the wearer briskly turning their neck) or due to a rapidly approaching external object. In some implementations, the distinction between such events may result in the same or nearly identical signals being generated by the one or more proximity sensor(s) 106. Such signals may be distinguished based on signals provided by the one or more gyroscopic sensor(s) 108 which generates a signal only when the one or more gyroscopic sensor(s) 108 are moved, thereby disambiguating the motion of the proximity sensing headphone 102 from the movement of an external object in the three-dimensional ambient environment about the proximity sensing headphone 102.

The one or more audio sensor(s) 110 may include any number and/or combination of current and/or future developed sensors, sensor systems, and/or sensor arrays capable of detecting audio or sounds in three-dimensional space external to the proximity sensing headphone 102. The one or more audio sensor(s) 110 may generate or otherwise produce one or more outputs that include data or information indicative audio or sounds in the three-dimensional space external to the proximity sensing headphone 102.

In some implementations, the one or more control circuits 112 may receive a signal from the one or more audio sensor(s) 110 on a regular, periodic, aperiodic, or intermittent basis. In such implementations, the one or more control circuits 112 may determine, detect, or otherwise sense the presence and/or passage of an external object in the three-dimensional space external to the proximity sensing headphone 102.

The one or more control circuits 112 may include any number and/or combination of current and/or future developed circuits that include one or more electrical components and/or semiconductor devices and which are capable of executing machine-readable instruction sets to provide the proximity sensing headphone functionality described herein. In some implementations the one or more control circuits 112 may be communicably coupled to one or more storage devices 116. The one or more storage devices 116 may include any number and/or combination of storage devices and/or systems capable of retaining or otherwise storing data. The one or more storage devices 116 may store or otherwise retain data and/or machine-readable instruction sets executable by the one or more control circuits 112.

Responsive to receiving signals from the one or more proximity sensor(s) 108, one or more gyroscopic sensor(s) 108, and/or one or more audio sensor(s) 110, the one or more control circuits 112 may generate one or more alert outputs when the detected distance to an external object or the detected velocity of an external object in the three-dimensional ambient environment exceeds a defined threshold indicative of presenting a threat or danger to the party wearing the proximity sensing headphones 102. In some implementations, the one or more control circuits 112 may reduce the volume of the audio output devices 104 in response to detecting an external object at a distance less than a defined threshold distance from and/or traveling at a velocity exceeding a threshold velocity towards the proximity sensing headphones 102. In other implementations, the one or more control circuits 112 may provide audible caution alerts via the audio output devices 104 in response to detecting an external object at a distance less than a defined threshold distance from and/or traveling at a velocity exceeding a threshold velocity towards the proximity sensing headphones 102. In yet other implementations, the one or more control circuits 112 may produce a haptic or visible output in response to detecting an external object at a distance less than a defined threshold distance from and/or traveling at a velocity exceeding a threshold velocity towards the proximity sensing headphones 102.

Figure 2:
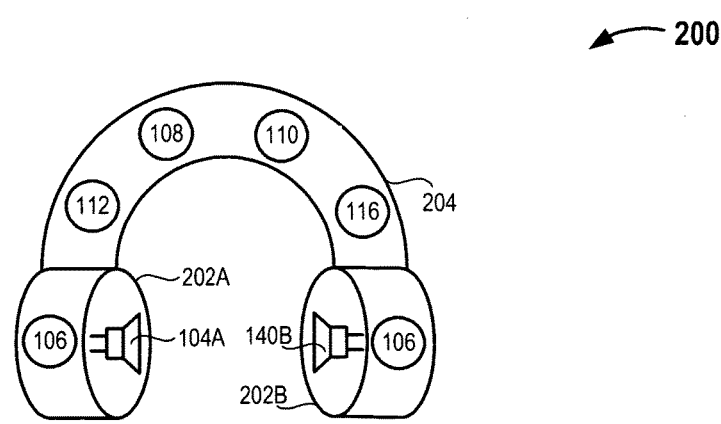
FIG. 2 is a schematic diagram of an illustrative proximity sensing headphone apparatus, in accordance with at least one embodiment of the present disclosure.

FIG. 2 is a schematic diagram of an illustrative proximity sensing headphone apparatus 200, in accordance with at least one embodiment of the present disclosure. In some implementations, the one or more audio output devices 104A, 104B may each be disposed at least in part within a respective housing 202A, 202B. For example, the one or more audio output devices 104 may be disposed in housings such as an "over the ear" headphone "can." In some implementations, the one or more audio output devices 104 may be disposed in a housing or structure that may be disposed at least partially within the user's ear canal or external auditory meatus, such as found in an "ear bud."

In some implementations the one or more audio output devices 104 may be operably coupled to a frame 204 or similar structure that accommodates the placement of the one or more audio output devices 104 proximate a user's ears. In some implementations, the frame may include one or more flexible members, one or more rigid members, or combinations thereof.

In some implementations, some or all of the one or more proximity sensor(s) 106, the one or more gyroscopic sensor(s) 108, and/or the one or more audio sensor(s) 110 may be disposed in on or about the housings 202, the frame 204, or any combination thereof. In some implementations, the one or more control circuits 112 and/or the one or more storage devices 116 may be disposed in on or about the housings 202, the frame 204, or any combination thereof.

In embodiments, the proximity sensing headphones 200 may include an on-board power supply to provide power to some or all of the one or more proximity sensor(s) 106, the one or more gyroscopic sensor(s) 108, the one or more audio sensor(s) 110, the one or more control circuits 112, the one or more storage devices 116, or combinations thereof. In some implementations, the on-board power supply may include one or more replaceable batteries. In other implementations, the proximity sensing headphones 200 may include one or more renewable energy storage devices (e.g., secondary batteries). In some implementations, the one or more energy storage devices may include a number of secondary storage devices that may be charged by conductively coupling the portable electronic device or smartphone to the proximity sensing headphone. In some implementations, the proximity sensing headphone 200 may be powered in whole or in part by a conductively coupled portable electronic device or smartphone.

The incorporation of the one or more proximity sensor(s) 106, one or more gyroscopic sensor(s) 108, one or more audio sensor(s) 110, and the one or more control circuits 112 in the proximity sensing headphones 102 increases the power overhead on the communicably coupled portable electronic device. A typical sleep mode power demand presented by these devices is generally less than 5 microwatts (μW) and active mode power consumption may be as high as 400 milliwatts (mW). Conventional (i.e., non-proximity sensing) headphones consume about 5 watts. The additional load presented by the sensors 106, 108, 110 and the control circuit 112 is thus less than 20% of the total power consumption.

For example, a bike rider wearing a proximity sensing headphone 200 attempts to cross a roadway by turning from a bike lane into a traffic lane. An automobile is proceeding at a relatively high rate of speed in the traffic lane and is unseen by the bike rider. As the automobile approaches the bike rider, the one or more proximity sensor(s) 106 detect the presence of the external object (i.e., the automobile) in the three-dimensional ambient environment. The one or more control circuits 112 may obtain at least one sample from the one or more proximity sensor(s) 106 and determine an approximate distance between the automobile and the one or more proximity sensor(s) 106. In some implementations, the one or more control circuits 112 may obtain several samples from the one or more proximity sensor(s) 106 and determine an approximate velocity of the automobile. If the distance to the automobile and/or the velocity of the automobile exceeds defined threshold values, the one or more control circuits 112 may generate one or more alerts 114 to warn the bike rider of the approaching automobile. In some implementations, the one or more control circuits 112 may generate an alert signal in the left audio output device 104 to warn the bike rider of the automobile approaching to their left.

In another example set in an office environment, a first person is attempting to gain the attention of a second person, facing away from the first person, and wearing proximity sensing headphones 200. The first person waves or makes a similar motion. The one or more control circuits 112 may obtain samples from the one or more proximity sensor(s) 106 that include data indicative of the passage of the first person's hand through the three-dimensional ambient environment of the one or more proximity sensor(s) 106. Responsive to detecting the movement of the first person's hand, the one or more control circuits 112 may alter or adjust one or more output parameters of the audio output devices 104 in the proximity sensing headset 102 worn by the second person.

Other example applications where the proximity sensing headphones 200 may prove advantageous include, but are not limited to:

Traveling across difficult terrain where sudden movements and unseen hazards may be sensed by a proximity sensing headphone 200 and timely alerts may be provided by the proximity sensing headphone 200 to the wearer;

A skier wearing a proximity sensing headphone 200 may be alerted to the rapid approach of another skier; and Workers wearing proximity sensing headphones 200 as hearing protection are made aware of approaching external objects in the workplace.

Figure 3:
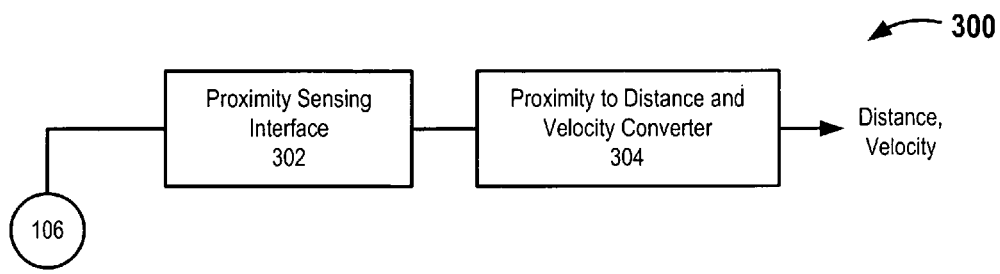
FIG. 3 is a schematic diagram of an illustrative distance and velocity determination system using the one or more proximity sensor(s) as applied by the one or more control circuits, in accordance with at least one embodiment of the present disclosure.

FIG. 3 is a schematic diagram of an illustrative distance and velocity determination system using the one or more proximity sensor(s) 106 as applied by the one or more control circuits 112, in accordance with at least one embodiment of the present disclosure. In some implementations, the one or more control circuits 112 may receive a number of signals from the one or more proximity sensor(s) 106 at a proximity sensing interface 302. Each of the signals received at the proximity sensing interface 302 may include data or information indicative of a distance between the one or more proximity sensor(s) 106 and an external object in the three-dimensional environment external to the proximity sensing headphones 102.

The one or more control circuits 112 may use one or more proximity to distance and velocity converters 304 to convert at least a portion of the number of signals to a value representative of the distance between the one or more proximity sensor(s) 106 and an external object in the three-dimensional environment external to the proximity sensing headphones 102. In embodiments, the one or more control circuits 112 may use one or more proximity to distance and velocity converters 304 to convert a plurality of distance measurements over a known time interval to at least one value representative of the velocity of an external object in the three-dimensional environment external to the proximity sensing headphones 102.

Figure 4:
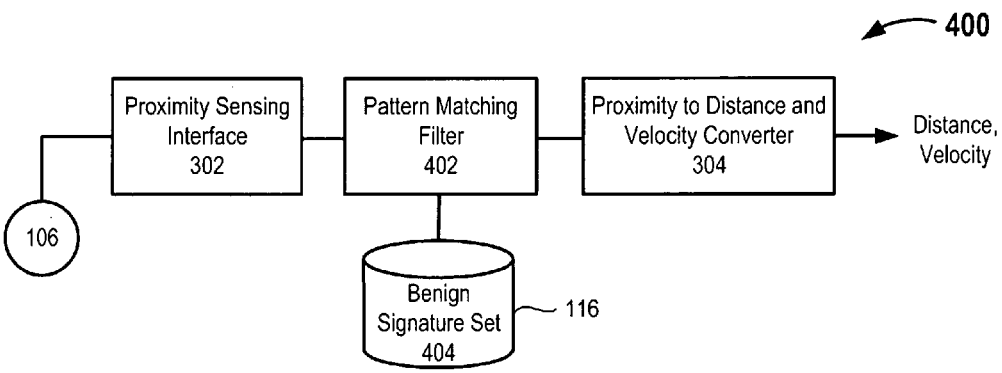
FIG. 4 is a schematic diagram of an illustrative proximity sensing headphone signal processing system that may be used in conjunction with the illustrative distance and velocity determination system of FIG. 3 to minimize the generation of false positive alert signals by the proximity sensing headphone, in accordance with at least one embodiment of the present disclosure.

FIG. 4 is a schematic diagram of an illustrative proximity sensing headphone signal processing system 400 that may be used in conjunction with the illustrative distance and velocity determination system of FIG. 3 to minimize the generation of false positive alert signals by the proximity sensing headphone 102, in accordance with at least one embodiment of the present disclosure. In some implementations, the proximity sensing headphone 102 may demonstrate sensitivity to ambient movement within the three-dimensional ambient environment about the proximity sensing headphones 102. In some implementations, the one or more control circuits 112 may include a signal processing system 400 that includes or otherwise incorporates one or more pattern matching filters 402 and one or more benign signature set storage devices 404 to reduce the likelihood of false alert generation by the proximity sensing headphone 102. In some implementations, the signal processing system 400 may include the one or more pattern matching filters 402 between the pattern matching interface 302 and the distance and velocity converter 304.

In such an implementation, the one or more control circuits 112 may pass the incoming proximity signals through the one or more pattern matching filters 402. The one or more pattern matching filters 402 may compare the signal received from the one or more proximity sensor(s) 106 with a known set or library of benign signatures 404. In some implementations the benign signature set 404 may be stored or otherwise retained in whole or in part on the one or more storage devices 116. In some implementations, the known set or library of benign signatures 404 may be updateable by the user of the proximity sensing headphone 102.

Where a proximity signal received at the proximity sensing interface 302 matches or demonstrates a sufficient degree of similarity to a signature stored in the benign signature set 404, the proximity sensing headphone 102 may not issue an alert 114 to the user. Where a received proximity signal received at the proximity sensing interface 302 does not match or demonstrates an insufficient degree of similarity to a signature stored in the benign signature set 404, the proximity sensing headphone 102 may issue an alert 114 to the user. Such an implementation advantageously minimizes the generation of false positives by the proximity sensing headphones 102 due to over sensitization of the proximity sensing headphones 102 to ambient movement.

Figure 5:
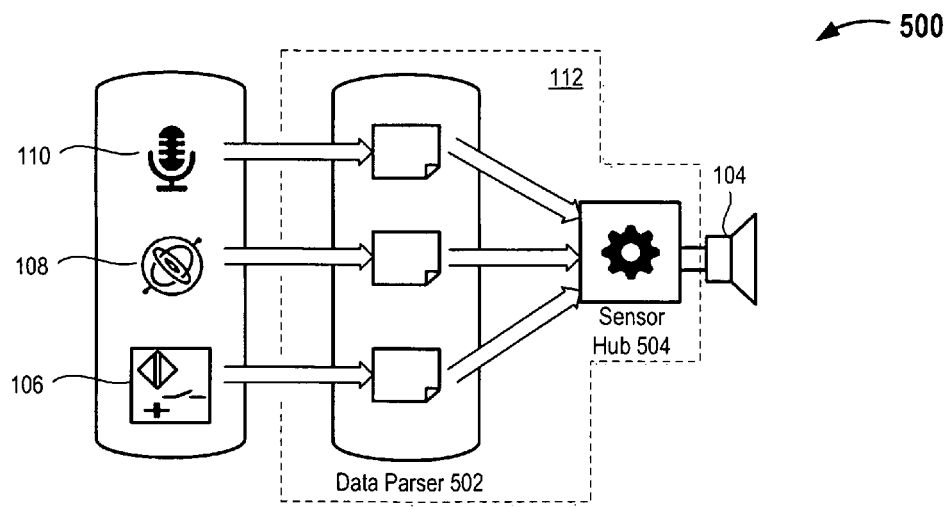
FIG. 5 is a block diagram of an illustrative audio signal processing system implemented by one or more control circuits, in accordance with at least one embodiment of the present disclosure.

FIG. 5 is a block diagram of an illustrative audio signal processing system 500 implemented by one or more control circuits 112 in a proximity sensing headphone 102, in accordance with at least one embodiment of the present disclosure. In some implementations, the one or more control circuits 112 may include a number of sensor interfaces, for example a proximity sensor interface, a gyroscopic sensor interface, an audio sensor interface, or combinations thereof. These interfaces may be formed with or communicably coupled to a data parser 502 or similar logical structure that receives the signals from each of the sensors 106, 108, 110. In some implementations, the data parser 502 may include one or more noise reduction systems, one or more signal enhancement systems, or combinations thereof that improve the signal content or quality received by the one or more control circuits 112.

In some implementations, the one or more control circuits 112 may include a number of sensor hubs 504 that receive and integrate at least a portion of the signals received from the one or more proximity sensor(s) 106, one or more gyroscopic sensor(s) 108, one or more audio sensor(s) 110, or combinations thereof. For example, the sensor hub 504 may receive signals from a number of proximity sensors 106 and a number of gyroscopic sensors 108 and may disambiguate the signals to distinguish between motion of the proximity sensor headset 102 and movement of one or more external objects within the three-dimensional ambient environment about the proximity sensor headset 102.

Figure 6:
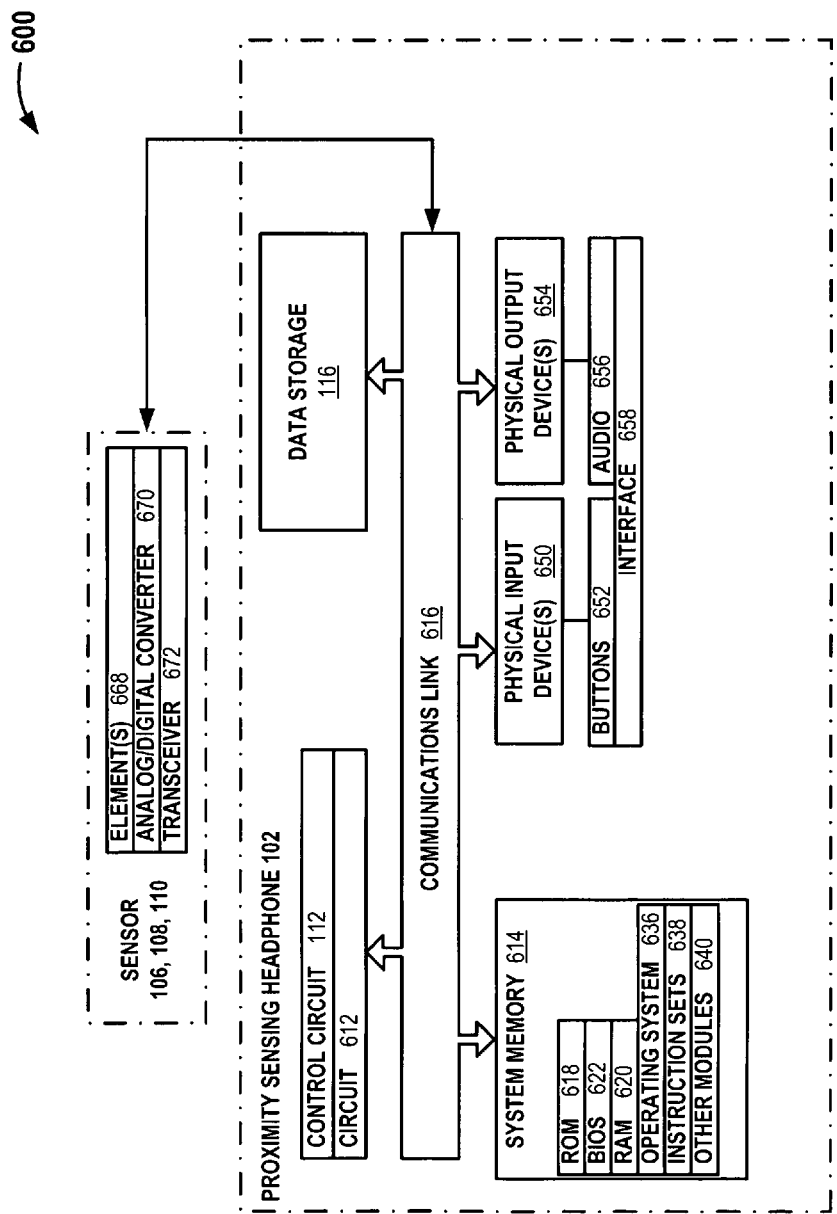
FIG. 6 is a simplified schematic depicting an illustrative proximity sensing headphone system, in accordance with at least one embodiment of the present disclosure.

FIG. 6 and the following discussion provide a brief, general description of the components forming an illustrative proximity sensing headphone 102 that includes one or more control circuits 112 communicably coupled to one or more proximity sensor(s) 106, one or more gyroscopic sensor(s) 108, one or more audio sensor(s) 110, or combinations thereof in which the various illustrated embodiments can be implemented. Although not required, some portion of the embodiments will be described in the general context of machine-readable or computer-executable instruction sets, such as program application modules, objects, or macros being executed by the one or more control circuits 112. Those skilled in the relevant art will appreciate that the illustrated embodiments as well as other embodiments can be practiced with other circuit-based device configurations, including portable electronic or handheld electronic devices, for instance smartphones, portable computers, wearable computers, microprocessor-based or programmable consumer electronics, and the like.

The proximity sensing headphones 102 may include any number of circuits, some or all of which may include electronic devices and/or semiconductor components that are disposed partially or wholly in a system capable of executing machine-readable instructions. The proximity sensing headphones 102 may include any number of circuits 612, and may, at times, include a communications link 616 that couples various system components including a system memory 614 to the number of circuits 612.

Each circuit 612 may include any number, type, or combination of electronic devices and/or semiconductor components that are selectively communicably coupleable based at least in part on instructions provided by one or more machine-readable instruction sets. At times, each circuit 612 may be implemented in whole or in part in the form of semiconductor devices such as diodes, transistors, inductors, capacitors, and resistors. Such an implementation may include, but is not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), field programmable gate arrays (FPGAs), and the like. Unless described otherwise, the construction and operation of the various blocks shown in FIG. 6 are of conventional design. As a result, such blocks need not be described in further detail herein, as they will be understood by those skilled in the relevant art. The communications link 616 that interconnects at least some of the components of the proximity sensing headphones 102 may employ any known bus structures or architectures.

The system memory 614 may include read-only memory ("ROM") 618 and random access memory ("RAM") 620. A portion of the ROM 618 may contain a basic input/output system ("BIOS") 622. The BIOS 622 may provide basic functionality to the proximity sensing headphones 102, for example by causing the circuit 612 to load one or more machine-readable instruction sets that cause the circuit 612 to function as a dedicated, specific, and particular machine, such as the one or more control circuits 112.

The proximity sensing headphones 102 may include one or more communicably coupled, non-transitory, data storage devices 116. The one or more data storage devices 116 may include any current or future developed non-transitory storage devices. Non-limiting examples of such data storage devices 116 may include, but are not limited to any current or future developed nontransitory storage appliances or devices, such as one or more magnetic storage devices, one or more optical storage devices, one or more solid-state electromagnetic storage devices, one or more electroresistive storage devices, one or more molecular storage devices, one or more quantum storage devices, or various combinations thereof. In some implementations, the one or more data storage devices 116 may include one or more removable storage devices, such as one or more flash drives, compact flash (CF) drives, secure digital (SD) drives, or similar appliances or devices.

The one or more storage devices 116 may include interfaces or controllers (not shown) communicatively coupling the respective storage device or system to the communications link 616, as is known by those skilled in the art. The one or more storage devices 116 may contain machine-readable instruction sets, data structures, program modules, data stores, databases, logical structures, and/or other data useful to the one or more control circuits 112, such as the benign signature set 404.

Machine-readable instruction sets 638 and other modules 640 may be stored in whole or in part in the system memory 614. Such instruction sets 638 may be transferred from one or more storage devices 116 and stored in the system memory 614 in whole or in part as the machine-readable instruction sets are executed by the audio signal processing circuit 120. The machine-readable instruction sets 638 may include instructions or similar executable logic capable of providing the proximity sensing headphone functionality described herein.

For example, one or more machine-readable instruction sets 638 may cause the one or more control circuits 112 to use data or information carried by signals provided by one or more sensors 106, 108, 110 to determine a distance between the proximity sensing headphone 102 and an external object in the three-dimensional ambient environment about the proximity sensing headphone 102. One or more machine readable instruction sets 638 may cause the one or more control circuits 112 to use data or information carried by signals received from one or more sensors 106, 108, 110 over a defined interval or time period to determine at least one of: a direction of travel or a velocity of an external object moving through the three-dimensional ambient environment about the proximity sensing headphone 102.

One or more machine-readable instruction sets 638 may cause the one or more control circuits 112 to compare a determined distance to an external object in three-dimensional ambient environment about the proximity sensing headphone 102 to one or more threshold distances and provide an alert 114 if the determined distance is less than at least one of the one or more threshold distances. One or more machine-readable instruction sets 638 may cause the one or more control circuits 112 to compare a determined direction of travel and/or velocity of an external object moving through the three-dimensional ambient environment about the proximity sensing headphone 102 to one or more threshold directions of travel and/or velocities and provide an alert 114 if the determined direction of travel and/or velocity exceeds one or more directions of travel and/or velocities.

Users of the proximity sensing headphone 102 may provide, enter, or otherwise supply commands (e.g., acknowledgements, selections, confirmations, and similar) as well as information (e.g., additional benign signature sets) to the proximity sensing headphone 102 using one or more buttons 652 or similar input devices disposed in, on, or about the housing 202 or frame 204 of the proximity sensing headphone 102.

The proximity sensing headphone 102 may provide output to users via a number of physical output devices 654. In at least some implementations, the number of physical output devices 654 may include any current or future developed audio output devices 656. In some implementations, the proximity sensing headphones 102 may include one or more interfaces 658, such as one or more wireless interfaces (WiFi®, BLUETOOTH®, Near Field Communication, etc.) and/or one or more wired interfaces (Universal Serial Bus, mini USB, micro USB, etc.) that permit the proximity sensing headphones 102 to communicably couple to one or more external devices such as one or more computers or similar processor-based devices. In some implementations, the proximity sensing headphone 102 may receive updates and additional data or information such as additional benign signature sets via the one or more external devices.

For convenience, the one or more circuits 612, the system memory 614, the physical input devices 650 and the physical output devices 654 are illustrated as communicatively coupled to each other via the communications link 616, thereby providing connectivity between the above-described components. In alternative embodiments, the above-described components may be communicatively coupled in a different manner than illustrated in FIG. 6. For example, one or more of the above-described components may be directly coupled to other components, or may be coupled to each other, via one or more intermediary components (not shown). In some embodiments, all or a portion of the communications link 616 may be omitted and the components are coupled directly to each other using suitable tethered, hardwired, or wireless connections.

Each of the one or more proximity sensor(s) 106, gyroscopic sensor(s) 108, and/or audio sensor(s) 110 may include one or more sensing elements 668. In implementations, the one or more sensing elements 668 may include one or more sensing elements capable of detecting a presence of an external object in the three-dimensional ambient environment about the proximity sensing headphone 102. In implementations, the one or more sensing elements 668 may include one or more sensing elements capable of detecting a movement or motion of the proximity sensing headphone 102 in the three-dimensional ambient environment. In implementations, the one or more sensing elements 668 may include one or more sensing elements capable of detecting an audio emission from one or more external objects in the three-dimensional ambient environment about the proximity sensing headphone 102.

Each of the one or more proximity sensor(s) 106, gyroscopic sensor(s) 108, and/or audio sensor(s) 110 may include one or more devices or systems, such as one or more analog-to-digital (A/D) converters 670 capable of converting the analog output signal to a digital output signal that contains the data or information representative of the condition or parameter sensed and/or detected by the respective the one or more proximity sensor(s) 106, gyroscopic sensor(s) 108, and/or audio sensor(s) 110. Each of the one or more proximity sensor(s) 106, gyroscopic sensor(s) 108, and/or audio sensor(s) 110 may include one or more transceivers 672 capable of outputting the signal provided by the one or more proximity sensor(s) 106, gyroscopic sensor(s) 108, and/or audio sensor(s) 110 or the A/D converter 670 to the one or more control circuits 112.

Figure 7A:
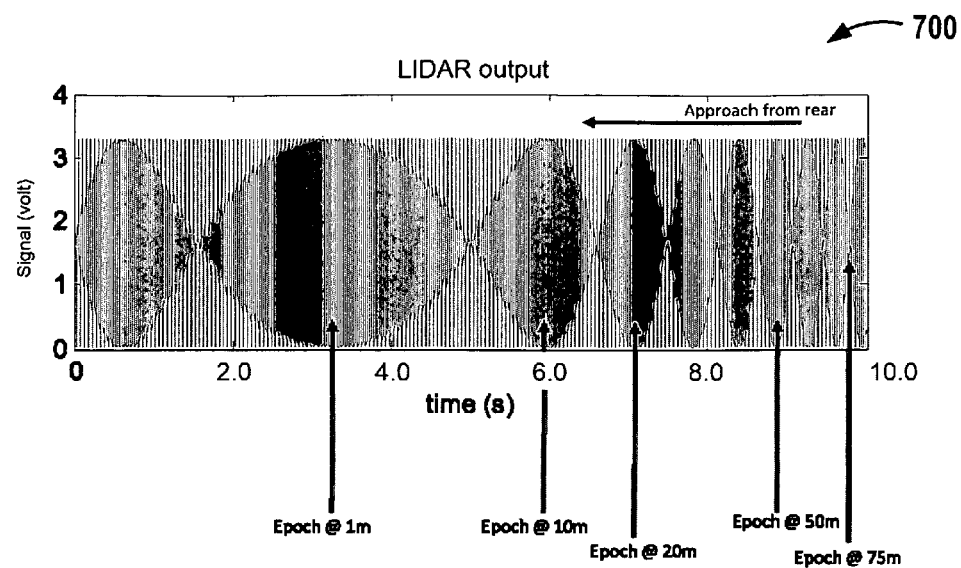
FIG. 7A is a time/signal strength plot of an illustrative LIDAR sensor output as an external object approaches the wearer of the headphone from the rear, in accordance with at least one embodiment of the present disclosure.
Figure 7B:
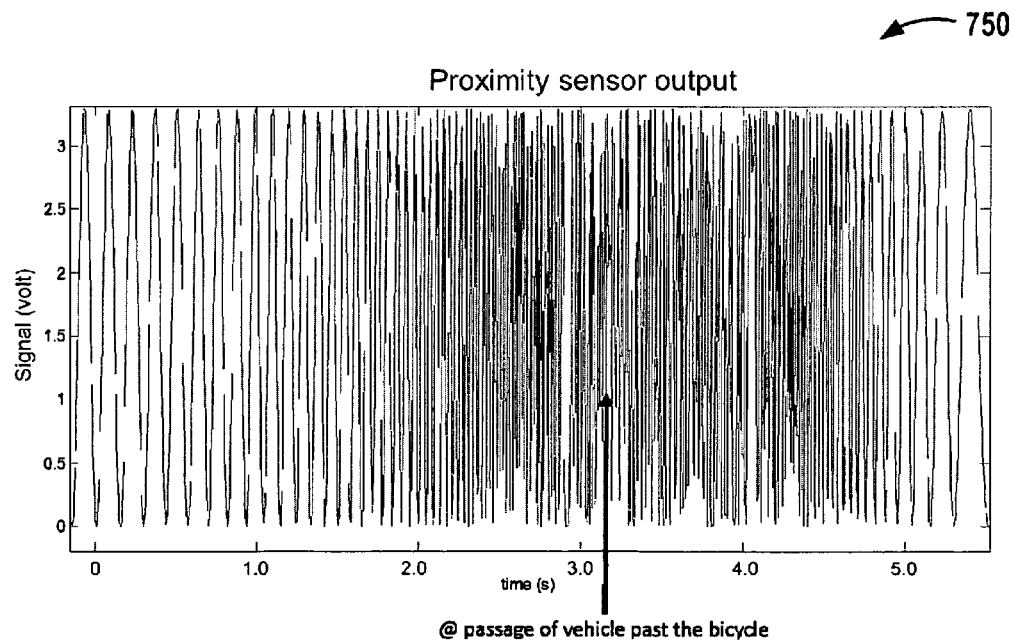
FIG. 7B is a time/signal strength plot of an illustrative proximity sensor output as an external object approaches the another time-based plot of a proximity sensing headphone sensor output as an object approaches the wearer of the headphone from the rear, in accordance with at least one embodiment of the present disclosure.

FIG. 7A is a time/signal strength plot 700 of an illustrative LIDAR sensor 106 that may be used in conjunction with the proximity sensing headphone 102, in accordance with at least one embodiment of the present disclosure. FIG. 7B is a time/signal strength plot 750 of an illustrative proximity sensor 106 that may be used in conjunction with the illustrative LIDAR sensor 106 to provide distance and velocity information for external objects moving through the three-dimensional ambient environment about the proximity sensing headphones 102, in accordance with at least one embodiment of the present disclosure.

Viewed together, FIGS. 7A and 7B provide an illustrative example signals representative of a rear-approaching automobile passing a bike rider equipped with a proximity sensing headphone 102. The plot 700 illustrates example LIDAR sensor signals and discernments at distances of 1 meter, 10 meters, 20 meters, 50 meters, and 75 meters. The plot 750 illustrates example proximity sensor signals as the automobile passes the bike rider at the three second point of the plots. Viewed together, the plots 700 and 750 demonstrate a LIDAR sensor and a proximity sensor 106 beneficially permit the one or more control circuits to recognize the approach of an external object (i.e., the automobile) and determine the velocity of the external object out to a distance of approximate 75 meters.

Figure 8:
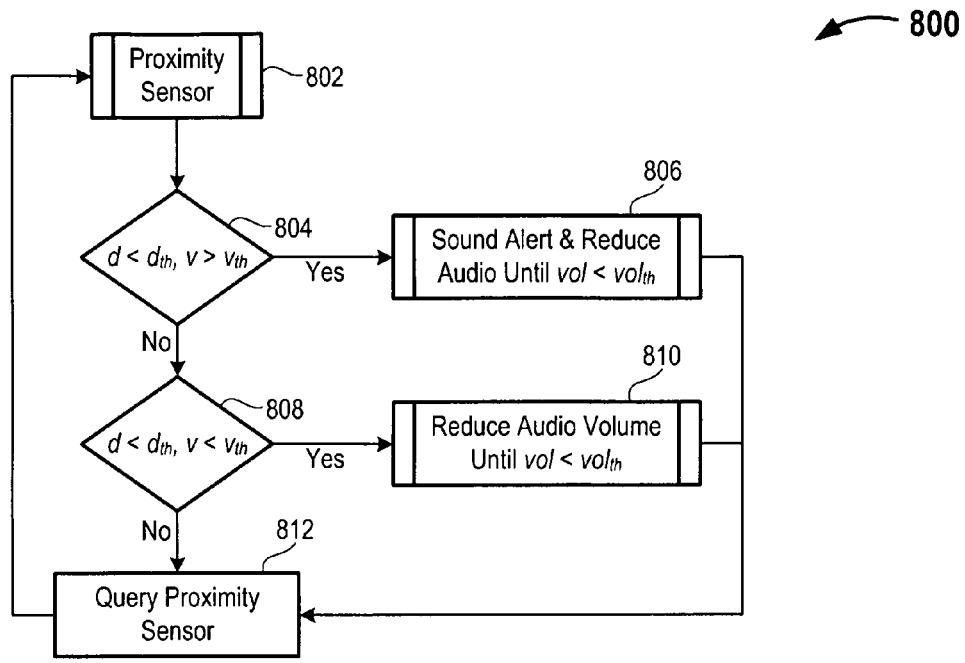
FIG. 8 is a proximity signal processing method used in conjunction with a proximity sensing headphone system, in accordance with at least one embodiment of the present disclosure.

FIG. 8 is an illustrative control logic flow diagram 800 that may be used by the proximity sensing headphone system 102, in accordance with at least one embodiment of the present disclosure. In embodiments, the one or more control circuits 112 may query the one or more proximity sensor(s) 106 to determine at least one of: a distance, a direction of travel, or a velocity of an external object in the three-dimensional ambient environment about the proximity sensing headset 102. At 802, the one or more control circuits 112 receive one or more signals that include data or information indicative of a distance to an external object in the three-dimensional ambient environment about the proximity sensing headphone 102.

In embodiments, the defined distance threshold ($d_{th}$) below which the one or more control circuits 112 perform one or more alert functions may be set or otherwise defined or determined by the user of the proximity sensing headphone 102. In other embodiments, the one or more control circuits 112 may autonomously determine the defined distance threshold (4) based on one or more signals (e.g., the gyroscopic signal) received by the one or more control circuits 112.

In embodiments, the defined velocity threshold ($v_{th}$) above which the one or more control circuits 112 perform one or more alert functions may be set or otherwise defined or determined by the user of the proximity sensing headphone 102. In other embodiments, the one or more control circuits 112 may autonomously determine the defined velocity threshold ($v_{th}$) based on one or more signals (e.g., the gyroscopic signal) received by the one or more control circuits 112.

Using the data or information in the received signals, the one or more control circuits 112 calculate the distance and velocity of the external objects in the three-dimensional ambient environment about the proximity sensing headset 102. At 804, the one or more control circuits 112 determine whether the calculated distance to the external object (d) is less than a defined distance threshold ($d_{th}$). At 804, the one or more control circuits 112 determine whether the calculated velocity of the external object (v) is greater than a defined velocity threshold ($v_{th}$). If the calculated distance to the external object (d) is less than a defined distance threshold ($d_{th}$) and the calculated velocity of the external object (v) is greater than a defined velocity threshold ($v_{th}$), the one or more control circuits 112 generates an alert 114 and reduces the audio output (vol) of some or all of the audio output devices 104 to a level less than a defined threshold ($vol_{th}$) at 806 and query the one or more proximity sensor(s) 106 at 812.

If the calculated distance to the external object (d) is greater than a defined distance threshold ($d_{th}$) or the calculated velocity of the external object (v) is less than a defined velocity threshold ($v_{th}$), the one or more control circuits 112 proceed to 808. At 808, the one or more control circuits 112 determine whether the calculated distance to the external object (d) is less than a defined distance threshold ($d_{th}$). At 808, the one or more control circuits 112 also determine whether the calculated velocity of the external object (v) is less than a defined velocity threshold ($v_{th}$). If the calculated distance to the external object (d) is less than a defined distance threshold ($d_{th}$) and the calculated velocity of the external object (v) is less than a defined velocity threshold ($v_{th}$), the one or more control circuits 112 reduce the audio output (vol) of some or all of the audio output devices 104 to a level less than a defined threshold ($vol_{th}$) at 810 and query the one or more proximity sensor(s) 106 at 812.

Figure 9:
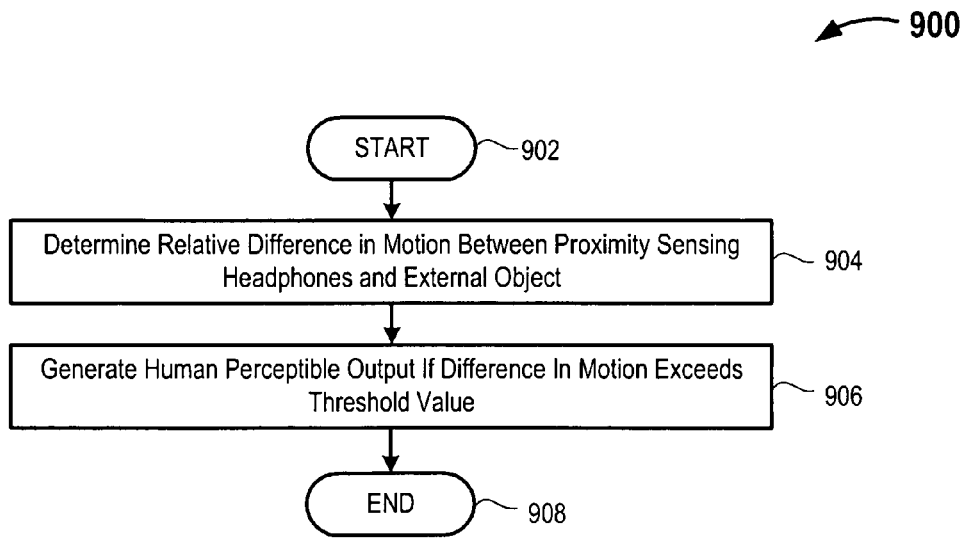
FIG. 9 is a high-level flow diagram of an illustrative signal processing method, in accordance with at least one embodiment of the present disclosure.

FIG. 9 is a high-level flow diagram of an illustrative signal processing method 900, in accordance with at least one embodiment of the present disclosure. In some implementations, the proximity sensing headphone 102 may include one or more proximity sensor(s) 106 and one or more gyroscopic sensor(s) 108. The one or more control circuits 112 may determine a relative motion between the proximity sensing headset 102 and an external object in the three-dimensional ambient environment about the proximity sensing headset 102. The method commences at 902.

At 904, the one or more control circuits 112 determine a relative difference in motion between the proximity sensing headphones 102 and an external object traveling through the three-dimensional ambient environment about the proximity sensing headphone 102.

At 906, the one or more control circuits 112 generate a human perceptible output if the determined relative difference in motion between the proximity sensing headphones 102 and the external object traveling through the three-dimensional ambient environment about the proximity sensing headphone 102 exceeds a defined threshold value. The method 900 concludes at 908.

The following examples pertain to further embodiments. The following examples of the present disclosure may comprise subject material such as a device, a method, at least one machine-readable medium for storing instructions that when executed cause a machine to perform acts based on the method, means for performing acts based on the method and/or a system for providing a proximity sensing headphone that provides alerts to a user based on the presence or movement of an external object through a three-dimensional ambient environment about the headphone structure of the proximity sensing headphones.

According to example 1, there is provided a proximity sensing headphone. The proximity sensing headphone may include a headphone structure, a first sensor to detect motion of the headphone structure in a three-dimensional space, and a second sensor to detect a movement of an external object in the three-dimensional space external to the headphone structure. The proximity sensing headphone may also include a control circuit communicably coupled to the first sensor and the second sensor and a storage device communicably coupled to the control circuit and including machine-readable instruction sets. The machine-readable instruction sets, when executed by the control circuit, cause the control circuit to provide a proximity sensing headphone control circuit that determines a relative difference between the motion of the headphone structure and the movement of the external object in the three-dimensional space and provides a human-perceptible output upon determining that the relative difference in the motion of the headphone structure and the movement of the external object exceeds a predefined threshold.

Example 2 may include elements of example 1 and the proximity sensing headphone may further include at least one audio output device.

Example 3 may include elements of example 1 where the first sensor may include at least one gyroscopic sensor that provides an output signal that includes data or information indicative of motion of the at least one gyroscopic sensor in the three-dimensional space.

Example 4 may include elements of example 3 where the second sensor may include at least one proximity sensor to provide an output signal that includes data or information indicative of a distance between the external object in the three-dimensional space external and the headphone structure.

Example 5 may include elements of example 4 where the machine-readable instruction sets may further cause the proximity sensing headphone control circuit to determine the movement of the external object in the three-dimensional space external to the headphone structure based at least in part on the distance data or information included in each of a plurality of second signals obtained over a defined time interval.

Example 6 may include elements of example 4 where the at least one proximity sensor may include at least one of: an electromagnetic induction proximity sensor, a capacitively coupled proximity sensor, or a time-of-flight proximity sensor.

Example 7 may include elements of example 3 where the second sensor may include a plurality of sensors that includes at least one proximity sensor.

Example 8 may include elements of example 7 where the plurality of sensors may include at least one microphone to provide an output signal that includes data or information indicative of ambient sound in the three-dimensional space.

Example 9 may include elements of example 1 where the human perceptible output may include an audible output provided via the at least one audio output.

Example 10 may include elements of example 1 where the at least one audio output device may include a plurality of audio output devices and where the human perceptible output may include an audio output provided by at least one of the plurality of audio output devices, the audio output indicative of the detected motion of the object in the three-dimensional space external to the headphone structure.

Example 11 may include elements of example 1 and the proximity sensing headphone may further include a haptic output device, wherein the human perceptible output may include a haptic output provided via the haptic output device.

Example 12 may include elements of example 1 and the proximity sensing headphone may further include a visual output device, wherein the human perceptible output may include a visible output provided via the visual output device.

According to example 13, there is provided a method of providing an indication of a presence of an external object via a proximity sensing headphone, the method may include determining, by a control circuit, a relative difference between a motion of the headphone structure in a three-dimensional space and a movement of an external object in the three-dimensional space external to the headphone structure and generating, by the proximity sensing headphone control circuit, a human-perceptible output responsive to a determination that the relative difference in the motion of the headphone structure in the three-dimensional space and the movement of the external object in the three-dimensional space external to the headphone structure exceeds a predefined threshold.

Example 14 may include elements of example 13 and the method of providing an indication of a presence of an external object via a proximity sensing headphone may further include generating, via a first sensor communicably coupled to the proximity sensing headphone control circuit, a first signal that includes data or information indicative of the motion of the headphone structure in the three-dimensional space and generating, via a second sensor communicably coupled to the proximity sensing headphone control circuit, a second signal that includes data or information indicative of at least one of: a position, a distance, or a location of the external object in the three-dimensional space external to the headphone structure.

Example 15 may include elements of example 14 where generating a first signal that includes data or information indicative of the motion of the headphone structure in the three-dimensional space may include generating, via a gyroscopic sensor operably coupled to the proximity sensing headphone and communicably coupled to the control circuit, a first signal that includes data or information indicative of the motion of the gyroscopic sensor in the three-dimensional space.

Example 16 may include elements of example 14 where generating a second signal that includes data or information indicative of the movement of the external object in the three-dimensional space external to the headphone structure may include generating, via a proximity sensor communicably coupled to the control circuit, a second signal that includes data or information indicative of a distance between the headphone structure and the external object in the three-dimensional space external to the headphone structure.

Example 17 may include elements of example 16 where determining a relative difference between a motion of the headphone structure in a three-dimensional space and a movement of an external object in the three-dimensional space external to the headphone structure may include determining, by the control circuit, the movement of the external object in the three-dimensional space external to the headphone structure based at least in part on at least one of: the position, the distance, or the location data or information included in each of a plurality of second signals obtained over a defined time interval.

Example 18 may include elements of example 17 where determining the movement of the external object in the three-dimensional space external to the headphone structure based at least in part on the distance data or information included in each of a plurality of second signals obtained over a defined time interval may include determining, by the control circuit, a direction and a velocity of the external object in the three-dimensional space external to the headphone structure based at least in part on the distance data or information included in each of a plurality of second signals obtained over a defined time interval.

Example 19 may include elements of example 16 where generating a second signal that includes data or information indicative of a distance between the headphone structure and the external object in the three-dimensional space external to the headphone structure may include generating a second signal that includes data or information indicative of a distance between the headphone structure and the external object in the three-dimensional space external to the headphone structure via a proximity sensor that includes at least one of: an electromagnetic induction proximity sensor, a capacitively coupled proximity sensor, or a time-of-flight proximity sensor.

Example 20 may include elements of example 13 where generating a human-perceptible output may include generating, via an audio output device communicably coupled to the control circuit, an audio output indicative of the detected motion of the object in the three-dimensional space external to the headphone structure.

Example 21 may include elements of example 13 where generating a human-perceptible output may include generating, via a haptic output device communicably coupled to the control circuit, a haptic output indicative of the detected motion of the object in the three-dimensional space external to the headphone structure.

Example 22 may include elements of example 13 where generating a human-perceptible output may include generating, via a visual output device communicably coupled to the control circuit, a visual output indicative of the detected motion of the object in the three-dimensional space external to the headphone structure.

According to example 23, there is provided a storage device that includes machine-readable instruction sets, that when executed by a circuit, cause the circuit to provide a control circuit. The control circuit may determine a relative difference between a motion of the headphone structure in a three-dimensional space and a movement of an object in the three-dimensional space external to the headphone structure and generate a human-perceptible output responsive to a determination that the relative difference in the motion of the headphone structure in the three-dimensional space and the movement of the external object in the three-dimensional space external to the headphone structure exceeds a predefined threshold.

Example 24 may include elements of example 23 where the machine-readable instructions may further cause the control circuit to cause a communicably coupled first sensor to generate a first signal that includes data or information indicative of the motion of the headphone structure in the three-dimensional space and may cause a communicably coupled second sensor to generate a second signal that includes data or information indicative of at least one of: a distance, a position, or a location of the external object in the three-dimensional space external to the headphone structure.

Example 25 may include elements of example 24 where the machine-readable instructions that cause the control circuit to determine a relative difference between a motion of the headphone structure in a three-dimensional space and a movement of an external object in the three-dimensional space external to the headphone structure may further cause the control circuit to cause a communicably coupled proximity sensor to generate a second signal that includes data or information indicative of a distance between the headphone structure and the external object in the three-dimensional space external to the headphone structure and determine the movement of the external object in the three-dimensional space external to the headphone structure based at least in part on at least one of: the position, the distance, or the location data or information included in each of a plurality of second signals obtained over a defined time interval.

According to example 26, there is provided a system for providing an indication of a presence of an external object via a proximity sensing headphone. The system may include a means for determining a relative difference between a motion of the headphone structure in a three-dimensional space and a movement of an external object in the three-dimensional space external to the headphone structure and a means for generating a human-perceptible output responsive to a determination that the relative difference in the motion of the headphone structure in the three-dimensional space and the movement of the external object in the three-dimensional space external to the headphone structure exceeds a predefined threshold.

Example 27 may include elements of example 26, and the system for providing an indication of a presence of an external object via a proximity sensing headphone may further include a means for generating a first signal that includes data or information indicative of the motion of the headphone structure in the three-dimensional space and a means for generating a second signal that includes data or information indicative of at least one of: a position, a distance, or a location of the external object in the three-dimensional space external to the headphone structure.

Example 28 may include elements of example 26 where the means for generating a first signal that includes data or information indicative of the motion of the headphone structure in the three-dimensional space may include a gyroscopic means for generating a first signal that includes data or information indicative of the motion of the headphone structure in the three-dimensional space.

Example 29 may include elements of example 27 where the means for generating a second signal that includes data or information indicative of the movement of the external object in the three-dimensional space external to the headphone structure may include a proximity detection means for generating a second signal that includes data or information indicative of a distance between the headphone structure and the external object in the three-dimensional space external to the headphone structure and a means for determining the movement of the external object in the three-dimensional space external to the headphone structure based at least in part on at least one of: the position, the distance, or the location data or information included in each of a plurality of second signals obtained over a defined time interval.

Example 30 may include elements of example 29 where the means for determining the movement of the external object in the three-dimensional space external to the headphone structure may include a means for determining at least one of a direction or a velocity of the external object in the three-dimensional space external to the headphone structure based at least in part on the position, the distance, or the location data or information included in each of a plurality of second signals obtained over a defined time interval.

Example 31 may include elements of example 29 where the means for generating a second signal that includes data or information indicative of at least one of: a position, a distance, or a location of the external object may include a means for generating a second signal that includes data or information indicative of a distance between the headphone structure and the external object in the three-dimensional space external to the headphone structure via a proximity sensing means that includes at least one of: an electromagnetic induction proximity sensing means, a capacitively coupled proximity sensing means, or a time-of-flight proximity sensor.

Example 32 may include elements of example 26 where the means for generating a human-perceptible output may include a means for generating an audio output indicative of the detected motion of the object in the three-dimensional space external to the headphone structure.

Example 33 may include elements of example 26 where the means for generating a human-perceptible output may include a means for generating a haptic output indicative of the detected motion of the object in the three-dimensional space external to the headphone structure.

Example 34 may include elements of example 26 where the means for generating a human-perceptible output may include a means for generating a visual output indicative of the detected motion of the object in the three-dimensional space external to the headphone structure.

According to example 35, there is provided a proximity sensing headphone control circuit. The proximity sensing headphone control circuit may include at least one circuit and at least one storage device that includes machine-readable instruction sets. The machine-readable instruction set, when executed by the at least one circuit, may cause the at least one circuit to determine a relative difference between a motion of a headphone structure in a three-dimensional space and a movement of an external object in the three-dimensional space external to the headphone structure and may cause a communicably coupled output device to generate a human-perceptible output responsive to a determination that the relative difference in the motion of the headphone structure in the three-dimensional space and the movement of the external object in the three-dimensional space external to the headphone structure exceeds a predefined threshold.

Example 36 may include elements of example 35 where the machine-readable instructions that cause the at least one circuit to determine a relative difference between a motion of a headphone structure in a three-dimensional space and a movement of an external object in the three-dimensional space external to the headphone structure may further cause the at least one circuit to receive, from a communicably coupled first sensor, a first signal that includes data or information indicative of the motion of the headphone structure in the three-dimensional space and receive, from a communicably coupled second sensor, a second signal that includes data or information indicative of at least one of: a position, a distance, or a location of the external object in the three-dimensional space external to the headphone structure.

Example 37 may include elements of example 36 where the machine-readable instructions that cause the at least one circuit to receive a first signal that includes data or information indicative of the motion of the headphone structure in the three-dimensional space may further cause the at least one circuit to receive, from a communicably coupled gyroscopic sensor, the first signal that includes the data or information indicative of the motion of the headphone structure in the three-dimensional space.

Example 38 may include elements of example 36 where the machine-readable instructions that cause the at least one circuit to receive a second signal that includes data or information indicative of at least one of: a position, a distance, or a location of the external object in the three-dimensional space external to the headphone structure may further cause the at least one circuit to receive, from a communicably coupled proximity sensor, a second signal that includes data or information indicative of at least one of: a position, a distance, or a location of the external object in the three-dimensional space external to the headphone structure.

Example 39 may include elements of example 38 where the machine-readable instructions that cause the at least one circuit to determine a relative difference between a motion of an headphone structure in a three-dimensional space and a movement of an external object in the three-dimensional space external to the headphone structure may further cause the at least one circuit to determine the movement of the external object in the three-dimensional space external to the headphone structure based at least in part on at least one of: the position, the distance, or the location data or information included in each of a plurality of second signals obtained over a defined time interval.

Example 40 may include elements of example 39 where the machine-readable instructions that cause the at least one circuit to determine the movement of the external object in the three-dimensional space external to the headphone structure based at least in part on at least one of: the position, the distance, or the location data or information included in each of a plurality of second signals obtained over a defined time interval may further cause the at least one circuit to determine at least one of a direction or a velocity of the external object in the three-dimensional space external to the headphone structure based at least in part on at least one of: the position, the distance, or the location data or information included in each of the plurality of second signals obtained over the defined time interval.

Example 41 may include elements of example 38 where the machine-readable instructions that cause the at least one circuit to receive, from a communicably coupled second sensor, a second signal that includes data or information indicative of at least one of: a position, a distance, or a location of the external object may further cause the at least one circuit to receive the second signal that includes data or information indicative of at least one of: the position, the distance, or the location of the external object in the three-dimensional space external to the headphone structure from the communicably coupled proximity sensor that includes at least one of: an electromagnetic induction proximity sensor, a capacitively coupled proximity sensor, or a time-of-flight proximity sensor.

Example 42 may include elements of example 38 where the machine-readable instructions that cause a communicably coupled output device to generate a human-perceptible output may further cause the at least one circuit to cause a communicably coupled audio output device to generate a human-perceptible audio output.

Example 43 may include elements of example 38 where the machine-readable instructions that cause a communicably coupled output device to generate a human-perceptible output may further cause the at least one circuit to cause a communicably coupled haptic output device to generate a human-perceptible haptic output.

Example 44 may include elements of example 38 where the machine-readable instructions that cause a communicably coupled output device to generate a human-perceptible output may further cause the at least one circuit to cause a communicably coupled video output device to generate a human-perceptible video output.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A proximity sensing headphone, comprising:
   a headphone structure;
   a first sensor to detect motion of the headphone structure in a three-dimensional space;
   a second sensor to detect a movement of an external object in the three-dimensional space external to the headphone structure;
   a control circuit communicably coupled to the first sensor and the second sensor; and
   a storage device communicably coupled to the control circuit and including machine-readable instruction sets that, when executed by the control circuit, cause the control circuit to provide a proximity sensing headphone control circuit that:
      determines a relative difference between the motion of the headphone structure and the movement of the external object in the three-dimensional space; and
      provides a human-perceptible output upon determining that the relative difference in the motion of the headphone structure and the movement of the external object exceeds a predefined threshold.

2. The proximity sensing headphone of claim 1 further comprising:
   at least one audio output device physically coupled to the headphone structure.

3. The proximity sensing headphone of claim 1 wherein the first sensor comprises at least one gyroscopic sensor that provides an output signal that includes data or information indicative of motion of the headphone structure in the three-dimensional space.

4. The proximity sensing headphone of claim 3 wherein the second sensor comprises at least one proximity sensor to provide an output signal that includes data or information indicative of a distance between the external object in the three-dimensional space external and the headphone structure.

5. The proximity sensing headphone of claim 4 wherein the machine-readable instruction sets further cause the control circuit to:
   determine the movement of the external object in the three-dimensional space external to the headphone structure based at least in part on the distance data or information included in each of a plurality of second signals obtained over a defined time interval.

6. The proximity sensing headphone of claim 4 wherein the at least one proximity sensor includes at least one of: an electromagnetic induction proximity sensor, a capacitively coupled proximity sensor, or a time-of-flight proximity sensor.

7. The proximity sensing headphone of claim 3 wherein the second sensor comprises a plurality of sensors that includes at least one proximity sensor.

8. The proximity sensing headphone of claim 7 wherein the plurality of sensors includes at least one microphone to provide an output signal that includes data or information indicative of ambient sound in the three-dimensional space.

9. The proximity sensing headphone of claim 1 wherein the human perceptible output comprises an audible output provided via at least one audio output device, wherein the audible output identifies at least a relative direction of the external object with respect to the headphone structure.

10. The proximity sensing headphone of claim 1:
    further comprising a plurality of audio output devices; and
    wherein the human perceptible output comprises an audio output provided by at least one of the plurality of audio output devices, the audio output indicative of the detected motion of the object in the three-dimensional space external to the headphone structure.

11. The proximity sensing headphone of claim 1, further comprising a haptic output device, wherein the human perceptible output comprises a haptic output provided via the haptic output device.

12. The proximity sensing headphone of claim 1, further comprising a visual output device, wherein the human perceptible output comprises a visible output provided via the visual output device.

13. A method of providing an indication of a presence of an external object via a proximity sensing headphone, the method comprising:
    determining, by a proximity sensing headphone control circuit, a relative difference between a motion of a headphone structure in a three-dimensional space and a movement of an external object in the three-dimensional space external to the headphone structure; and
    generating, by the proximity sensing headphone control circuit, a human-perceptible output responsive to a determination that the relative difference in the motion of the headphone structure in the three-dimensional space and the movement of the external object in the three-dimensional space external to the headphone structure exceeds a predefined threshold.

14. The method of claim 13, further comprising:
generating, via a first sensor communicably coupled to the proximity sensing headphone control circuit, a first signal that includes data or information indicative of the motion of the headphone structure in the three-dimensional space; and
generating, via a second sensor communicably coupled to the proximity sensing headphone control circuit, a second signal that includes data or information indicative of at least one of: a position, a distance, or a location of the external object in the three-dimensional space external to the headphone structure.

15. The method of claim 14 wherein generating a first signal that includes data or information indicative of the motion of the headphone structure in the three-dimensional space comprises:
generating, via a gyroscopic sensor operably coupled to the headphone structure and communicably coupled to the proximity sensing headphone control circuit, a first signal that includes data or information indicative of the motion of the headphone structure in the three-dimensional space.

16. The method of claim 14 wherein generating a second signal that includes data or information indicative of the movement of the external object in the three-dimensional space external to the headphone structure comprises:
generating, via a proximity sensor communicably coupled to the proximity sensing headphone control circuit, a second signal that includes data or information indicative of a distance between the headphone structure and the external object in the three-dimensional space external to the headphone structure.

17. The method of claim 16 wherein determining a relative difference between a motion of the headphone structure in a three-dimensional space and a movement of an external object in the three-dimensional space external to the headphone structure comprises:
determining, by the proximity sensing headphone control circuit, the movement of the external object in the three-dimensional space external to the headphone structure based at least in part on at least one of: the position, the distance, or the location data or information included in each of a plurality of second signals obtained over a defined time interval.

18. The method of claim 17 wherein determining the movement of the external object in the three-dimensional space external to the headphone structure based at least in part on the distance data or information included in each of a plurality of second signals obtained over a defined time interval comprises:
determining, by the proximity sensing headphone control circuit, a direction and a velocity of the external object in the three-dimensional space external to the headphone structure based at least in part on the distance data or information included in each of a plurality of second signals obtained over a defined time interval.

19. The method of claim 16 wherein generating a second signal that includes data or information indicative of a distance between the headphone structure and the external object in the three-dimensional space external to the headphone structure comprises:
generating a second signal that includes data or information indicative of a distance between the headphone structure and the external object in the three-dimensional space external to the headphone structure via a proximity sensor that includes at least one of: an electromagnetic induction proximity sensor, a capacitively coupled proximity sensor, or a time-of-flight proximity sensor.

20. The method of claim 13 wherein generating a human-perceptible output comprises:
generating, via an audio output device communicably coupled to the proximity sensing headphone control circuit, an audio output indicative of the location of the object in the three-dimensional space external to the headphone structure.

21. The method of claim 13 wherein generating a human-perceptible output comprises:
generating, via a haptic output device communicably coupled to the proximity sensing headphone control circuit, a haptic output indicative of the detected motion of the object in the three-dimensional space external to the headphone structure.

22. The method of claim 13 wherein generating a human-perceptible output comprises:
generating, via a visual output device communicably coupled to the proximity sensing headphone control circuit, a visual output indicative of the detected motion of the object in the three-dimensional space external to the headphone structure.

23. A storage device that includes machine-readable instruction sets, that when executed by a circuit, cause the circuit to provide a proximity sensing headphone control circuit, the proximity sensing headphone control circuit to:
determine a relative difference between a motion of a headphone structure in a three-dimensional space and a movement of an external object in the three-dimensional space external to the headphone structure; and
generate a human-perceptible output responsive to a determination that the relative difference in the motion of the headphone structure in the three-dimensional space and the movement of the external object in the three-dimensional space external to the headphone structure exceeds a predefined threshold.

24. The storage device of claim 23 wherein the machine-readable instructions further cause the proximity sensing headphone control circuit to:
cause a communicably coupled first sensor to generate a first signal that includes data or information indicative of the motion of the headphone structure in the three-dimensional space; and
cause a communicably coupled second sensor to generate a second signal that includes data or information indicative of at least one of: a distance, a position, or a location of the external object in the three-dimensional space external to the headphone structure.

25. The storage device of claim 24 wherein the machine-readable instructions that cause the proximity sensing headphone control circuit to determine a relative difference between a motion of the headphone structure in a three-dimensional space and a movement of an external object in the three-dimensional space external to the headphone structure further cause the proximity sensing headphone control circuit to:
cause a communicably coupled proximity sensor to generate a second signal that includes data or information indicative of a distance between the headphone structure and the external object in the three-dimensional space external to the headphone structure; and
determine the movement of the external object in the three-dimensional space external to the headphone structure based at least in part on at least one of: the position, the distance, or the location data or information included in each of a plurality of second signals obtained over a defined time interval.

* * * * *